(12) United States Patent
Kernahan

(10) Patent No.: US 7,884,500 B2
(45) Date of Patent: Feb. 8, 2011

(54) HIGH VOLTAGE ARRAY CONVERTER

(75) Inventor: Kent Kernahan, Cupertino, CA (US)

(73) Assignee: Array Converter Inc., Sunnyvale, CA (US)

( * ) Notice: Subject to any disclaimer, the term of this patent is extended or adjusted under 35 U.S.C. 154(b) by 93 days.

(21) Appl. No.: 12/428,351

(22) Filed: Apr. 22, 2009

(65) Prior Publication Data

US 2009/0261655 A1 Oct. 22, 2009

Related U.S. Application Data

(60) Provisional application No. 61/046,886, filed on Apr. 22, 2008.

(51) Int. Cl.
H02J 1/10 (2006.01)

(52) U.S. Cl. .............. 307/52; 307/44; 307/69; 307/71; 307/77; 307/78; 307/82; 307/87

(58) Field of Classification Search ............... 307/44, 307/52, 69, 71, 77–78, 82, 87
See application file for complete search history.

(56) References Cited

U.S. PATENT DOCUMENTS

| | | | |
|---|---|---|---|
| 5,677,833 A | 10/1997 | Bingley | |
| 6,259,017 B1 * | 7/2001 | Takehara et al. | 307/82 |
| 6,750,391 B2 | 6/2004 | Bower et al. | |
| 6,969,967 B2 * | 11/2005 | Su | 318/801 |
| 7,161,082 B2 * | 1/2007 | Matsushita et al. | 136/244 |
| 7,576,449 B2 * | 8/2009 | Becker et al. | 307/45 |
| 7,596,008 B2 * | 9/2009 | Iwata et al. | 363/71 |
| 7,719,864 B2 * | 5/2010 | Kernahan et al. | 363/65 |
| 2005/0139259 A1 * | 6/2005 | Steigerwald et al. | 136/293 |
| 2006/0185727 A1 | 8/2006 | Matan | |
| 2008/0078436 A1 * | 4/2008 | Nachamkin et al. | 136/244 |
| 2009/0290393 A1 * | 11/2009 | Angerer et al. | 363/49 |
| 2010/0149847 A1 * | 6/2010 | Kernahan | 363/142 |
| 2010/0164288 A1 * | 7/2010 | Kernahan et al. | 307/52 |

* cited by examiner

Primary Examiner—Jared J Fureman
Assistant Examiner—Adi Amrany
(74) Attorney, Agent, or Firm—The Marbury Law Group PLLC

(57) ABSTRACT

A direct current to pulse amplitude modulated ("PAM") current converter, denominated a "PAMCC", is connected to an individual source of direct current. The PAMCC receives direct current and provides pulse amplitude modulated current at its output. An array of PAMCCs constructed in accordance with the present invention form a distributed multiphase inverter whose combined output is the demodulated sum of the current pulse amplitude modulated by each PAMCC. The array is configured as a series of stages, wherein the power sources within each stage are in parallel. The series of stages provides for a high voltage AC or DC output. In some embodiments a weak power source is compensated for by adjusting the voltage or the current of the weak power source.

7 Claims, 18 Drawing Sheets

HIGH VOLTAGE ARRAY CONVERTER

BACKGROUND

For many reasons, such as concerns for global warming caused by human activity, the increasing cost and potential eventual lack of availability of oil and natural gas, even the shortage of water for hydroelectric power, there is great interest in cost-effective methods and materials for providing energy. Much focus is brought to bear on renewable energy sources, especially upon electricity generated using photovoltaic panels. At the present time the widespread use and installation of electric capacity from solar equipment is hampered by many factors. Present solutions suffer from poor efficiency, short product lifetimes, a poor business model, consumer resistance to a substantial up-front cost that may not be recovered if the consumer does not continue living in a facility equipped with solar equipment long enough to recoup the capital costs.

FIG. 1A through FIG. 1C illustrate various configurations of solar systems comprising solar panels connected to inverters. FIG. 2 is an example of grid-connected photovoltaic systems, wherein the power provided by the solar system is driven into the grid system of a utility. A representative configuration of a system according to the prior art 202 shows a plurality of panels with a single inverter for converting the direct current provided by the panels in to alternating current electrical power. A representation of an example embodiment of the present invention is shown as system 204. Note that each panel of 204 includes a converter.

Electrical power sources are deployed in a variety of configurations, such as differing number of phases, providing a variety of voltages and type, such as alternating current of one or more phases ranging from 100 volts to many thousands of volts or direct current of any voltage. The prior art solutions for combining various power sources to provide these configurations have many difficulties, notably difficulty in continuing to provide adequate power after a failure of a subsystem.

SUMMARY

In the prior art large electrolytic capacitors are part of a system for converting direct electrical current into alternating current (see FIG. 3, Cdc1 and Cdc2 as examples of capacitors used in an inverter). The prior art solutions have discontinuous input current and require a large capacitor to convert this discontinuous flow into a continuous current flow through the photovoltaic cells which convert photons into electrical current. In the present invention, current mode input and output allow capacitors to be reduced in size below the requirement of electrolytic (or other volatile liquid based) technology. Energy storage for sine wave reconstruction is performed inductively with continuous mode current input from photovoltaic diodes. This reduces the role of capacitors to pulse shaping. The reliability of the design is governed by semiconductor margining, inductor insulation and core material margin and thermal cycle driven mechanical stress. With the technological limitation of electrolytic capacitors eliminated, lifetimes in excess of 25 years are possible.

High voltage at the module-grid interface reduces the typical current at the interface by a factor of about seven and improves tolerance to resistance by a factor of about fifty. Moving the connector system from tens of milliohms to a few ohms reduces contact surface and materials requirements while increasing tolerance to oxidation and contamination. For example: a 200 W, 220 V two phase array converter requires 910 ma and can tolerate up to about 2.4 ohms of interconnect resistance for a one percent power loss. Conversely, a 30 VDC, 200 W conventional solar panel integrated in a series string would require about 6.6 amps and could tolerate only up to 0.045 ohms of interconnect resistance for the same one percent power loss.

In the array converter architecture, the current path for both phases passes through the same coils in both directions. This results in identical current flowing in both phases.

Due to the balanced topology of array converters, the positive end to the diode array will tend to positioned above neutral by about the same voltage that the negative end is below neutral. This places the DC arc voltage far below the minimum strike potential. Limiting the internal array voltage in this manor together with almost total lack of AC components in the PV diode array (due to continuous conduction mode input current) largely eliminates the need for stringent leakage path to ground specifications found in high voltage DC string applications. This simplifies manufacturing process between the edge of the PV diode array and frame of the module, and the backside of the internal array and the back of the module. For example: if the leakage requirement of a 450V max string series connected panel between grounded frame and internal PV diode array is 2 ua, the insulation requirement is 225 M Ohms. In an array converter with a 30V maximum between PV diode array and neutral, the same leakage may only require 15 M Ohms insulation. The low nominal operating voltages of the PV diode array relative to ground also allow for the use of lower voltage spark gap and MOV components improving the path to ground for lightning and corona discharge (antennas) and other high voltage effects.

Practical electrolytic capacitors are fundamentally not suitable for long life applications at high temperatures. Existing solar inverter topologies use capacitance to convert PV diode arrays from current sources to voltage sources and for moving energy from valleys to peaks in the AC waveform. The capacitance density required by the prior art approaches requires electrolytic technology.

Whether cased by detected grid anomalies such as voltage out of bounds or locally or remotely originated shut down commands, the panels of the present invention are shut down to a safe state. In this state, the internal PV array is open circuit, internal inductors are discharged and internal power semiconductors are open circuit. In this state, a fireman's ax would experience no more than the open circuit voltage of the internal PV array, typically 40V. Since the safe state of the internal PV array is open, two short circuits would have to be formed (one to ground) for the ax to experience current or voltage.

To understand this limitation, consider the following: aluminum electrolytic capacitors are typically constructed from two conducting aluminum foils, one of which is typically coated with aluminum oxide as a dielectric, and a paper spacer soaked in electrolyte so as to conform mechanically to the opposite side of the dielectric. The aluminum foil insulated by the oxide layer is the anode while the liquid electrolyte and the second foil act as cathode.

Electrolytes may be boric acid or sodium borate in aqueous solution combined with chemicals to slow evaporation such as ethylene glycol. Since the electrolytes evaporate, and evaporation doubles for every 10 degrades centigrade, design life is a function of time and temperature. For example: if a typical electrolytic capacitor has a design life of 15 years at 45 degrees is subjected to 85 degrees, its life would drop to less than a year. Even if spent only $\frac{1}{12}$th of its life at this temperature (6 hours a day for four summer months a year), it's lifetime would be less than ½ the year target for solar arrays. Note that this is an intrinsic limitation of the technology and is not related to topology or circuit design.

In order to eliminate electrolytic capacitors a new topology is required. This new topology must interface to the PV diode array in constant current mode and use inductive storage to move energy from valleys to peaks in the AC waveform. A multiphase pulse amplitude modulated system implements these requirements, eliminating the need for electrolytic capacitor technology.

In the present invention, arrays of modules, wherein each module comprises a power source and an array power converter, are combined and configured to provide a desired high voltage DC or AC power. In some embodiments the arrays are configured to be tolerant of a reduction in power output or complete failure of a module. To provide high voltage, fault-tolerant power, one or more modules are combined in parallel to provide power wherein the output voltage is common to all of the modules so combined, and the current output is the summation of the modules. This forms one stage of power. Another stage may be similarly provided, wherein the negative terminal of the second stage is connected to the positive terminal of the first stage, thus providing a higher voltage equal to the two output voltages combined. Other stages may be added, also in series, to provide additional voltage. Since the current is in common, the power is then the product of the voltage provided by the configuration and the common current. In one embodiment the stages are connected in a wye configuration to provide for three phase electrical power.

In the event of degraded performance by a module, either partially or completely, the configuration of the remaining modules may be altered such that the resulting system continues to provide the same voltage output or the same current output. Thus a system according to this arrangement loses power only to the degree of the power degradation of the failed unit.

DETAILED DESCRIPTION OF SOME EMBODIMENTS

Definition of Some Terms

Figure 1D:
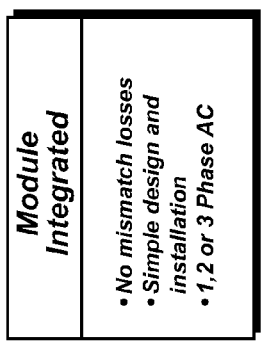
FIG. 1D is a simplified block diagram of one embodiment of the present invention.
Figure 1D:
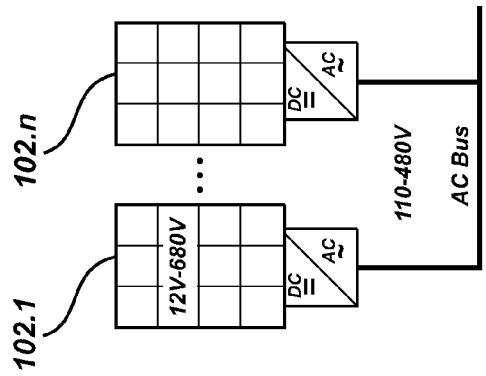
Figure 1C:
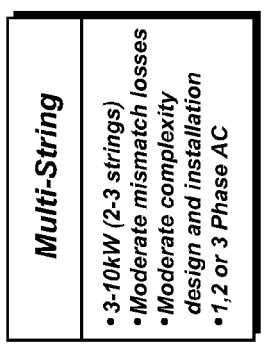
FIG. 1C is an example of prior art drawn to a multi-string system. PRIOR ART.
Figure 1C:
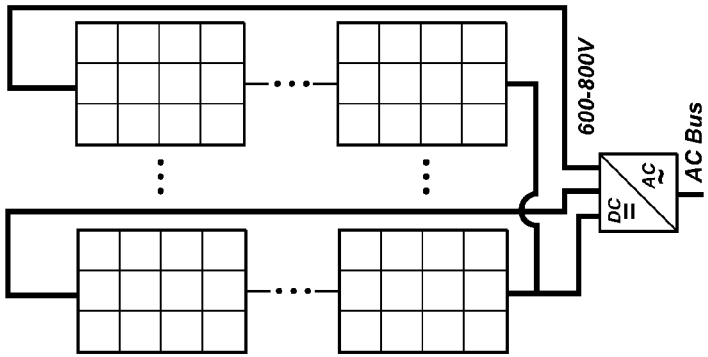
Figure 1B:
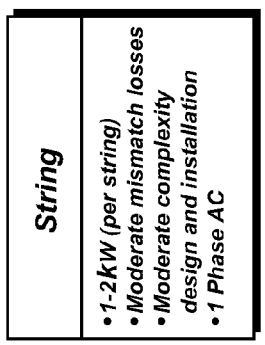
FIG. 1B is an example of prior art drawn to a string inverter system. PRIOR ART.
Figure 1B:
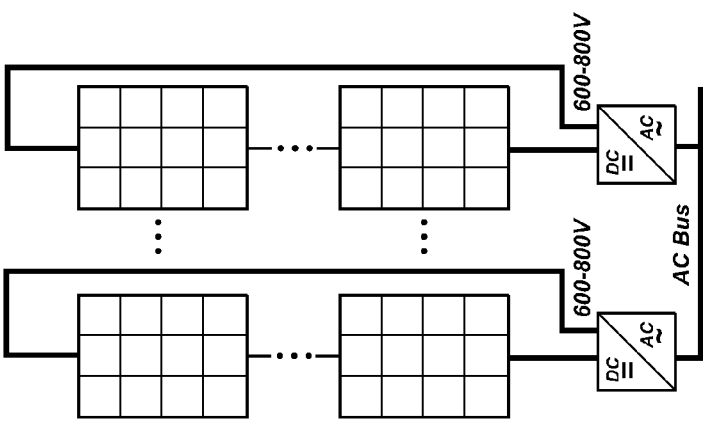
Figure 1A:
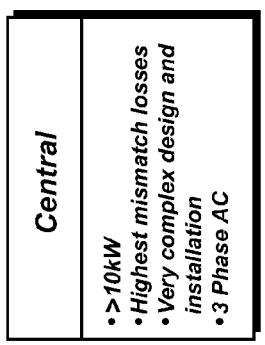
FIG. 1A is an example of prior art drawn to a central inverter system. PRIOR ART.
Figure 1A:
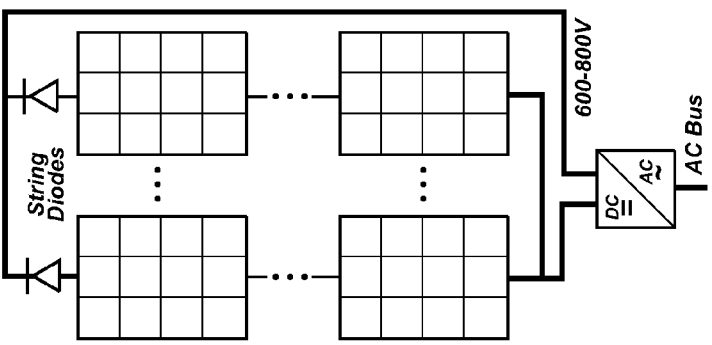
Figure 2:
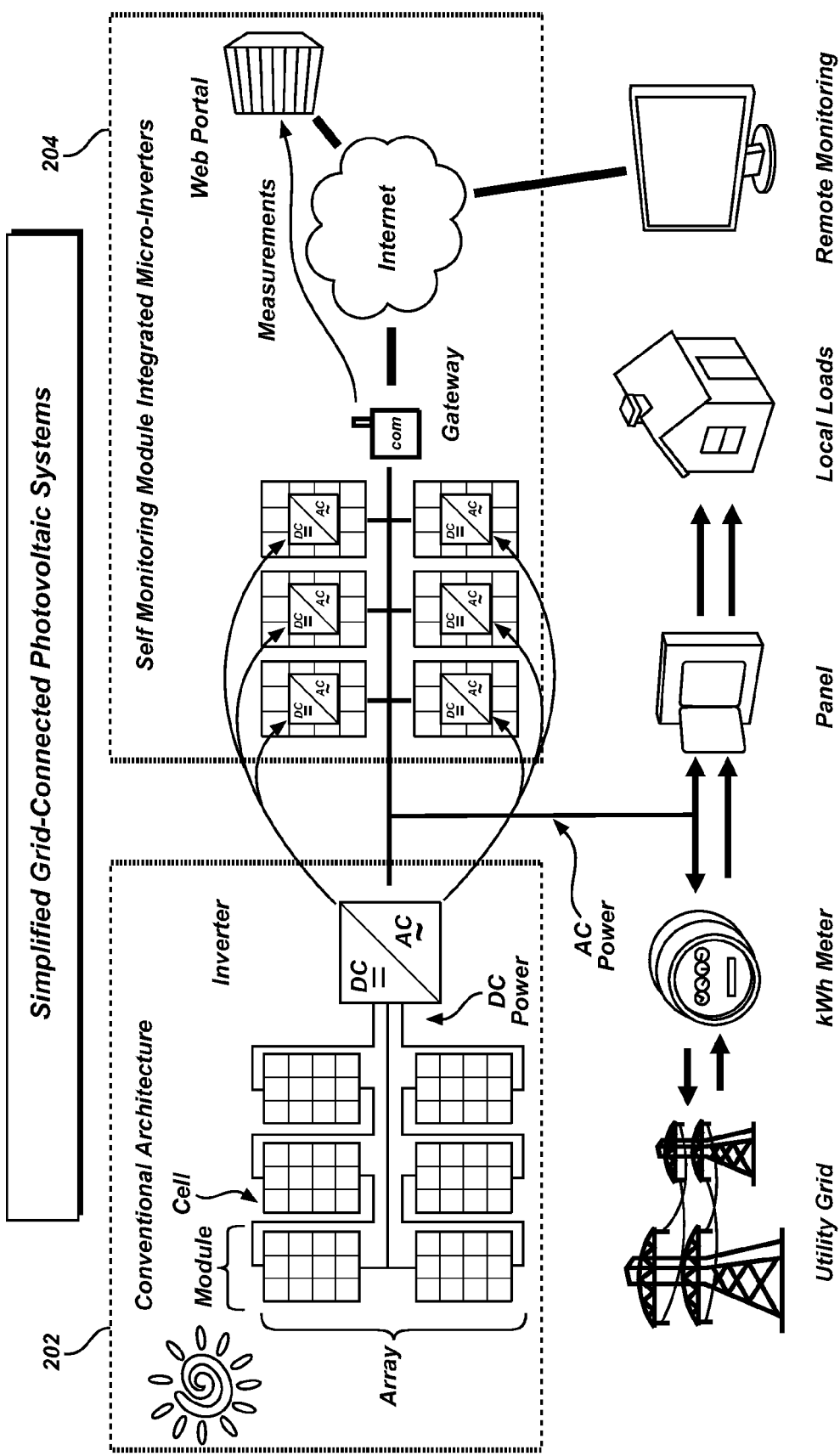
FIG. 2 is an example of grid-connected photovoltaic systems.
Figure 3:
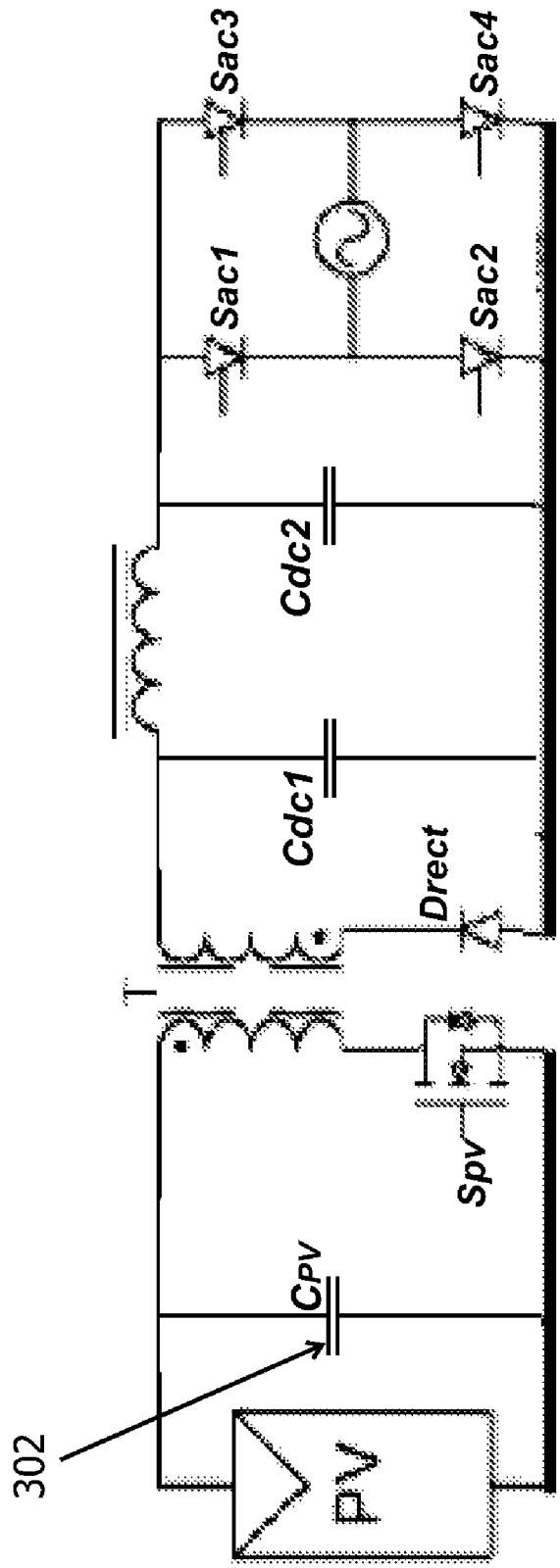
FIG. 3 is an example of a solar panel model connected to an example of an inverter. PRIOR ART.

| | |
|---|---|
| Islanding | Operation of an on-premises power generating system that is normally connected to a grid which continues to operate when it is not connected to the grid. |
| Grid | AC power provided to a premises by an outside source, typically a utility company. |
| PV | Photovoltaic panel; another term for the commonly-used "solar panel" |
| cps | Abbreviation for "cycles per second"; the frequency of an AC power supply |
| AC | Abbreviation for "alternating current", though one may also view it as "alternating voltage" in that the polarity of the voltage provided alternates. |
| DC | Abbreviation for "direct current"; electrical power that is always provided in a given polarity. The voltage of the power source may or may not be fixed. |
| FET | Field effect transistor |
| PAM | Pulse Amplitude Modulation. a form of signal modulation where the message information is encoded in the amplitude of a series of signal pulses. |
| PCM | Pulse Code Modulation. a digital representation of an analog signal where the magnitude of the signal is sampled regularly at uniform intervals, then quantized to a series of symbols in a digital (usually binary) code. |

According to the present invention, a DC to pulse amplitude modulated ("PAM" current converter, denominated a "PAMCC" is connected to an individual solar panel ("PV"). A solar panel typically is comprised of a plurality, commonly seventy-two, individual solar cells connected in series, wherein each cell provides approximately 0.5 volt at some current, the current being a function of the intensity of light flux impinging upon the panel. The PAMCC receives direct current ("DC") from a PV and provides pulse amplitude modulated current at its output. The pulse amplitude modulated current pulses are typically discontinuous or close to discontinuous with each pulse going from near zero current to the modulated current and returning to near zero between each pulse. The pulses are produced at a high frequency relative to the signal modulated on a sequence of pulses. The signal modulated onto a sequence of pulses may represent portions of a lower frequency sine wave or other lower frequency waveform, including DC. When the PAMCC's output is connected in parallel with the outputs of similar PAMCCs an array of PAMCCs is formed, wherein the output pulses of the PAMCCs are out of phase with respect to each other. An array of PAMCCs constructed in accordance with the present invention form a distributed multiphase inverter whose combined output is the demodulated sum of the current pulse amplitude modulated by each PAMCC. If the signal modulated onto the series of discontinuous or near discontinuous pulses produced by each PAMCC was an AC current sine wave, then a demodulated, continuous AC current waveform is produced by the array of PAMCCs. This AC current waveform is suitable for use by both the "load", meaning the premises that is powered or partially power by the system, and suitable for connection to a grid. For example, in some embodiments an array of a plurality of PV-plus-PAMCC modules are connected together to nominally provide split-phase, Edison system 60 cps 240 volt AC to a home.

Before discussing an array comprising a plurality of PV-plus-PAMCC modules, we first look at an individual PAMCC. For example, referring to FIG. 4, a PV panel is electronically represented by the diodes and capacitor shown as reference numeral 401. Collectively the components comprising an PAMCC (or sometimes "micro inverter") are referred to as simply "the PAMCC 400." Current is provided by the PV 401 to a positive input terminal 402 and a negative input terminal 403. The positive input terminal 403 is connected in series with a coil L1 406. The negative input terminal 404 is connected in series with a coil L2 405. In one embodiment coils L1 406 and L2 405 form a one-to-one transformer with two input and two output terminals. Such an embodiment provides better current matching through the two current paths. Hereinafter we refer to the single transformer as "T1" 407. A switch Q1 404, for example an NMOS FET, is connected across the load side of the transformer 407, with the source of Q1 404 connected in parallel to the negative terminal of the T1 407 output. Note that the negative sides of the PV 401 and of the PAMCC 400 are floating; that is, they are not grounded. A controller 412 has an output terminal 414 which provides a signal to the control gate (Q1G) of Q1 404 on a line 411. In some embodiments the controller 412 is a microprocessor with additional logic and is operated by a program. The controller 412 is discussed in more detail hereinafter.

The controller 412 comprises a plurality of output terminals, each operated independently. Four controller 412 output terminals 415 through 418 are connected to the control terminals of four SCRs (CR11 424; CR22 423; CR12 425; and CR21 426 respectively) by four lines 119 through 422 respectively (inner-connections not shown). Each line, therefore each SCR, is independently controlled by control signals from the controller 412. The anode terminals of CR11 424 and CR22 423 are connected in parallel to the positive output terminal of T1 407. The cathod terminals of SCRs CR12 425 and CR21 426 are connected in parallel to the negative output terminal of T1 407. The cathode terminal of SCR CR11 424 and the anode terminal of SCR CR12 425 are connected in parallel to a coil L12 430. The cathode terminal of SCR CR22 423 and the anode terminal of SCR CR21 426 are connected in parallel to a coil L22 431. A terminal 434 from coil L12 430 is arbitrarily designated as providing a "phase 1" (P1) output and a terminal 436 from coil L22 431 is arbitrarily designated as providing a "phase 2" (P2) output. In some embodiments the coils L12 430 and L22 431 are embodied in a one-to-one transformer. In the embodiment exemplified in FIG. 4 coils L12 430 and L22 136 are separate coils. A capacitor C12 438 is across the input side of coil L12 430 and a neutral output terminal 432. Another capacitor C22 is across the input side of coil L22 431 and the neutral output terminal 432. In another embodiment there is no neutral output terminal 432 and there is a single capacitor across the input terminals of coil L12 430 and L22431; in this embodiment the voltage rating of the capacitor is at least twice that of capacitors C22 440 and C12 438.

The method of the invention is implemented by control signals on lines 411 and 419 through 422. In particular the control signal Q1G on line 411 and signals CR11T on line 419; CR22T on line 420; CR12T on line 421; and CR21T on line 422 connect and disconnect the current provided by PV 401 in a sequence within the PAMCC 400 with a high-frequency period, for example 30 KHz, which provides a PCM signal which is modulated by a slower, 60 cycle pattern, thereby providing an output whose amplitude is a PAM signal approximating a sine wave.

Figure 4:
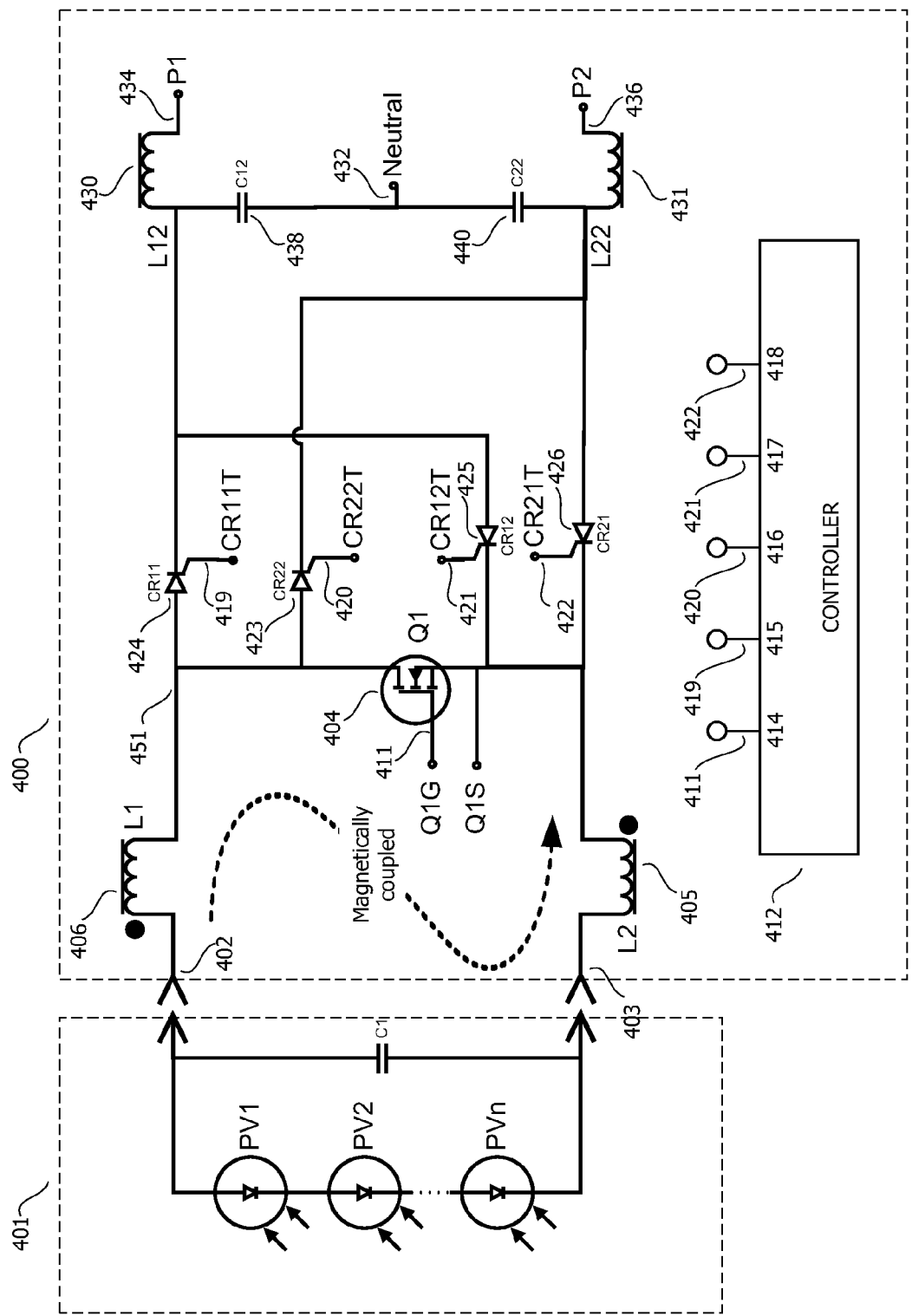
FIG. 4 is an example of a single pulse amplitude modulated current converter according to the present invention.

Referring to FIG. 4, the initial conditions are as follows: Q1 404, CR11 424, CR22 423, CR12 425 and CR21 426 de-energized; coils L1 406, L2 405, L12 430 and L22 431 empty of current; and photovoltaic cells PV1 through PVn dark. In this condition the grid AC voltage is applied between P1 434 and P2 436 and experiences a path through L12 430, C12 438, C22 440 and L22 431. The resonant frequency selected for a reconstruction filter comprising L12 430 and C12 438 is typically chosen to be about one half the switching frequency of Q1 404. The resonant frequency of a reconstruction filter comprising L22 431 and C22 440 is chosen to be the same as the reconstruction filter of L12 430 and C12 438. In one embodiment the transistor Q1 404 is selected for a specified switching frequency of approximately 30 kHz and the resonant frequency of the reconstruction filters are then designed for 15 kHz. With the grid AC voltage typically being 60 Hz, an unimportant amount of capacitive reactive load is presented to the grid.

Circuit operation begins with the solar panel 401 being exposed to sufficient light to produce significant current. The presence of the current may be observed as an increase in voltage across Q1 404. At this point Q1 404 is initially turned on by applying a signal from controller 412 on line 411 between Q1G and Q1S. The interface between the controller 412 and the transistor Q1 404 may be optically isoloated, transformer coupled, or the controller 412 may be connected to Q1S. In this state L1 406 and L2 405 begin to charge with current. When the voltage across PV 401 falls to a predetermined value, the time to charge the coils is noted in order to calculate the current and standard operation begins with the next grid zero crossing. In one embodiment this is when the voltage at P1 crosses above P2 while P1 is going positive and P2 is going negative. At this point signals CR11T 419 and CR21T 421 are asserted such that CR11 424 and CR21 426 will conduct when current are applied to them.

CASE 1: PWM Modulation for Positive Half Wave of the Grid

Figure 5:
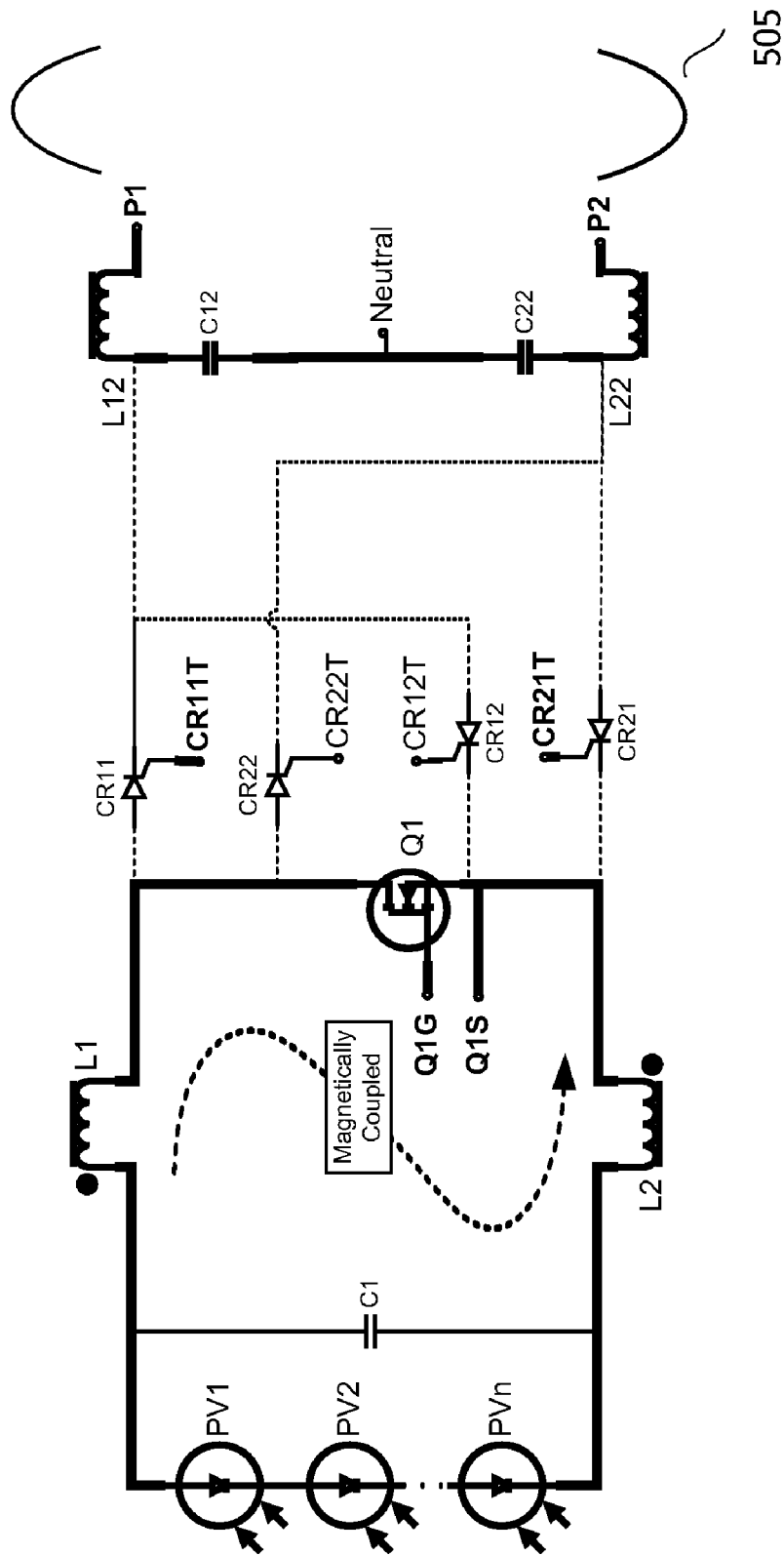
FIG. 5 shows a pulse amplitude modulated current converter with a transistor completing the circuit to charge inductors while reconstruction filters produce current pulses for the grid positive half phase.

Figures FIG. 5 through FIG. 8 will be referred to in describing the operation of PAMCC 400. Note that the components correspond to those of FIG. 4, but the reference numbers have been left off so as not to obscure the description. However we refer to the reference numbers provided by FIG. 4. Looking to FIG. 5, with L1 406 and L2 405 charged, Q1 404 is turned off for a pulse width modulated time. After the off time has expired, Q1 404 is turned on until the end of the current switching cycle. During the time that Q1 404 is off, current previously stored in L1 406 and L2 405, together with the current flowing in PV 401, is applied to the input terminals of CR11 424 and CR21 426, which remain enabled as a result of the signals CR11T 419 and CR21T 421 for the entire positive half cycle of the grid. The positive half cycle of the grid is defined as the condition wherein the voltage at output terminal P1 434 is greater than the voltage at output terminal P2 436. The charge in the current pulse delivered through the SCR CR11 424 is initially stored on capacitor C12 438, creating a voltage more positive on the near end of coil L12 430 relative to the end of coil L12 which is connected to the output terminal P1 434. The charge in the current pulse delivered through SCR CR21 426 is initially stored on capacitor C22 440, a voltage more negative on the near end of coil L22 431 relative to the end of coil L22 which is connected to the output terminal P2 436. This is the initial condition for both the reconstruction filter comprising L12 430, C12 438 and the reconstruction filter comprising L22 431, C22 440. At this point the reconstruction filters will transform the pulse width modulated current pulse delivered to them to a pulse amplitude modulated (PAM) half sine wave of current 505 delivered to the grid as shown in FIG. 5.

The resonant frequency for the reconstruction filters are chosen to be about one half the switching frequency of Q1 404 so that one half of a sine wave of current will be provided to P1 434 and P2 436 for each pulse width modulated current pulse delivered to them. Since the resonant frequency of each reconstruction filter is independent of the pulse width of current applied to it, and the charge in the instant current pulse applied to the reconstruction filter must be equal to the charge in the half sine wave of current delivered out of the reconstruction filter to the grid, changes in the pulse width of input current will be reflected as changes in the amplitude of the output of the reconstruction filters. As the current in the inductors in the reconstruction filters returns to zero, the next pulse of current is delivered to the capacitors of the reconstruction filters because the frequency of the reconstruction filters is one half the rate at which pulse width modulated current pulses are produced by Q1 404.

The off time of Q1 404 is modulated such that the width of current pulses produced is in the shape of the grid sine wave. The reconstruction filters transform this sequence of pulse width modulated current pulses into a sequence of pulse amplitude modulated current pulses whose amplitude follows corresponding points of the shape of the grid sine wave.

So long as the grid half cycle remains positive at the terminal P1 434 relative to the output of terminal P2 436, further current pulses are produced by repeating the process described hereinbefore, beginning at "CASE 1: PWM modulation for positive half wave of the grid".

The negative zero crossing of the grid voltage is defined as the condition wherein the voltage at terminal P1 434 is equal to the voltage at terminal P2 436 after P1 434 has been more positive than P2 436. Prior to the negative zero crossing, Q1 404 is turned on, thereby removing current from CR11 424 and CR21 426. At this point the signals CR11T 419 and CR21T 421 are de-asserted, preventing SCRs CR11 424 and CR21 426 from conducting current during the grid negative half cycle. After the negative zero crossing, with the voltage of terminal P1 434 more negative than the voltage of terminal P2 436, the signals CR22T 420 and CR12T 421 are then asserted, enabling CR22 423 and CR12 425 to conduct when current is applied to them.

Figure 6:
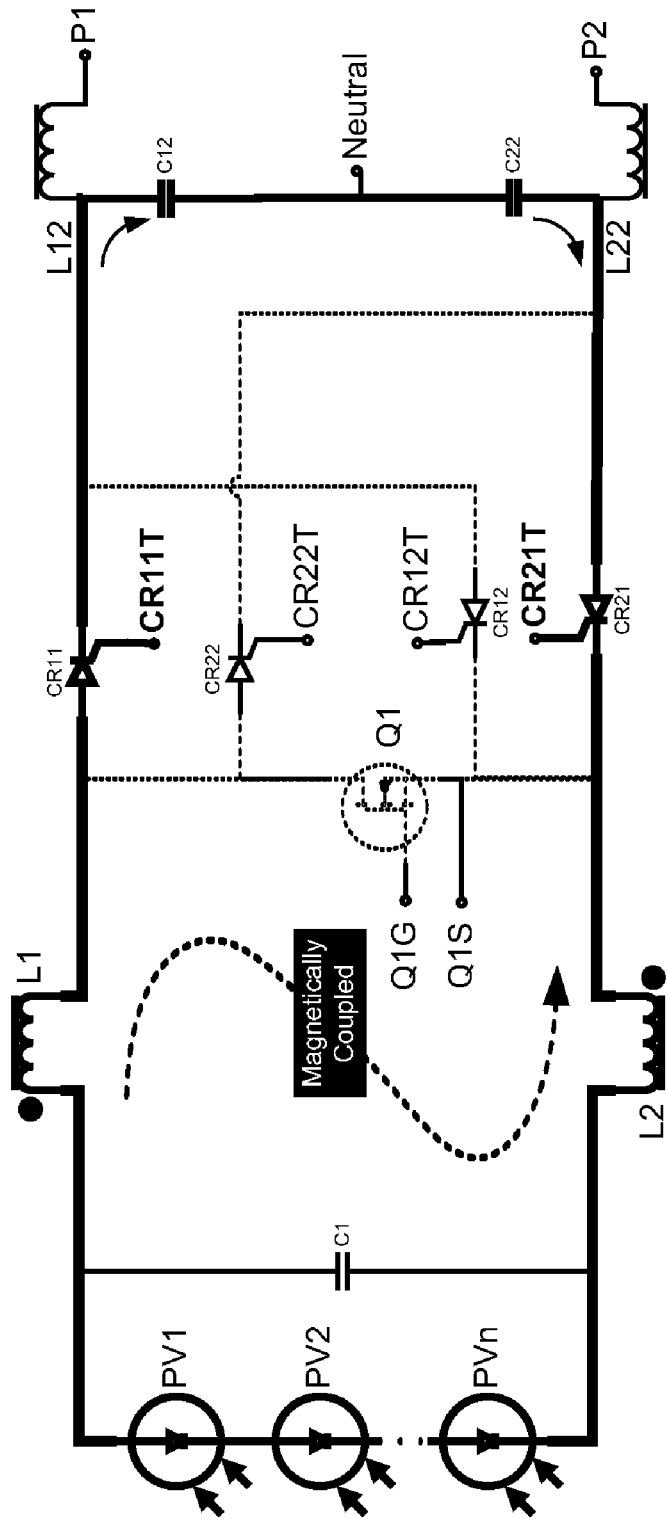
FIG. 6 shows a pulse amplitude modulated current converter with current flowing through into the reconstruction filters for the grid positive half phase.
Figure 7:
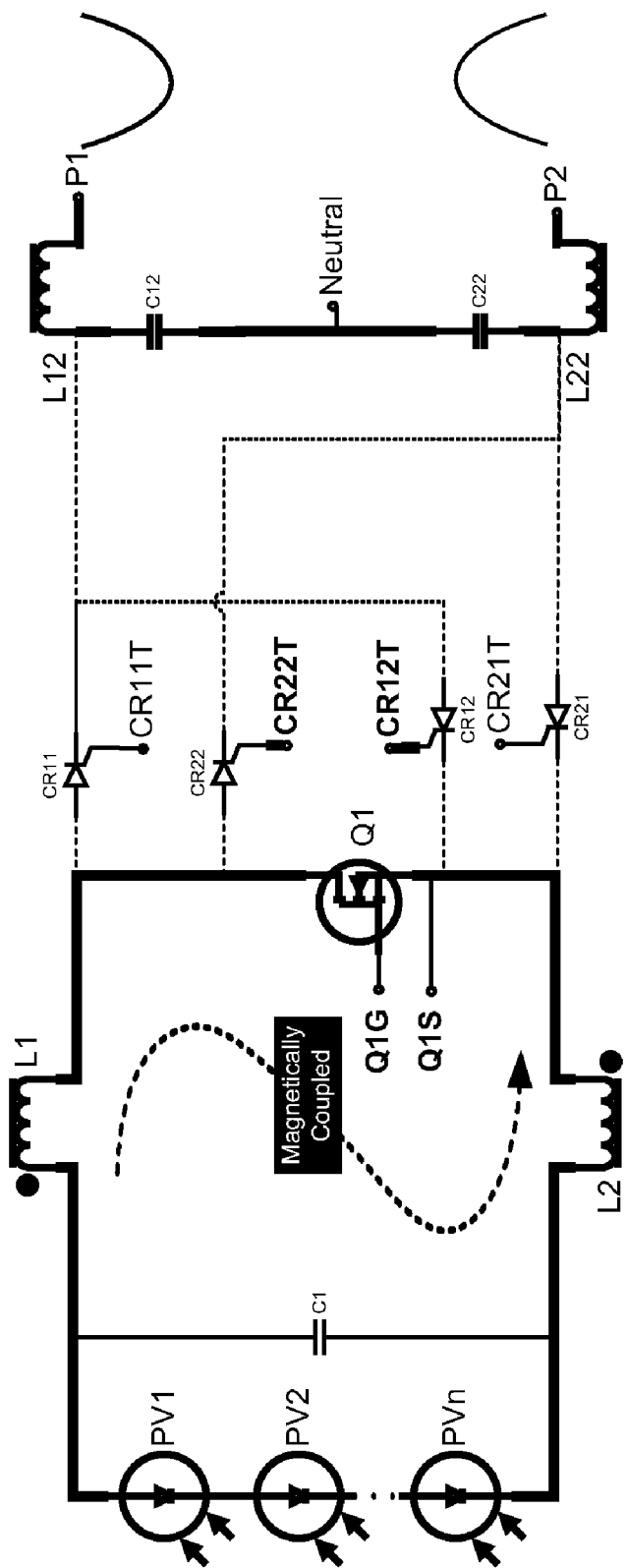
FIG. 7 shows a pulse amplitude modulated current converter with a transistor completing the circuit to charge inductors while reconstruction filters produce current pulses for the grid negative half phase.
Figure 8:
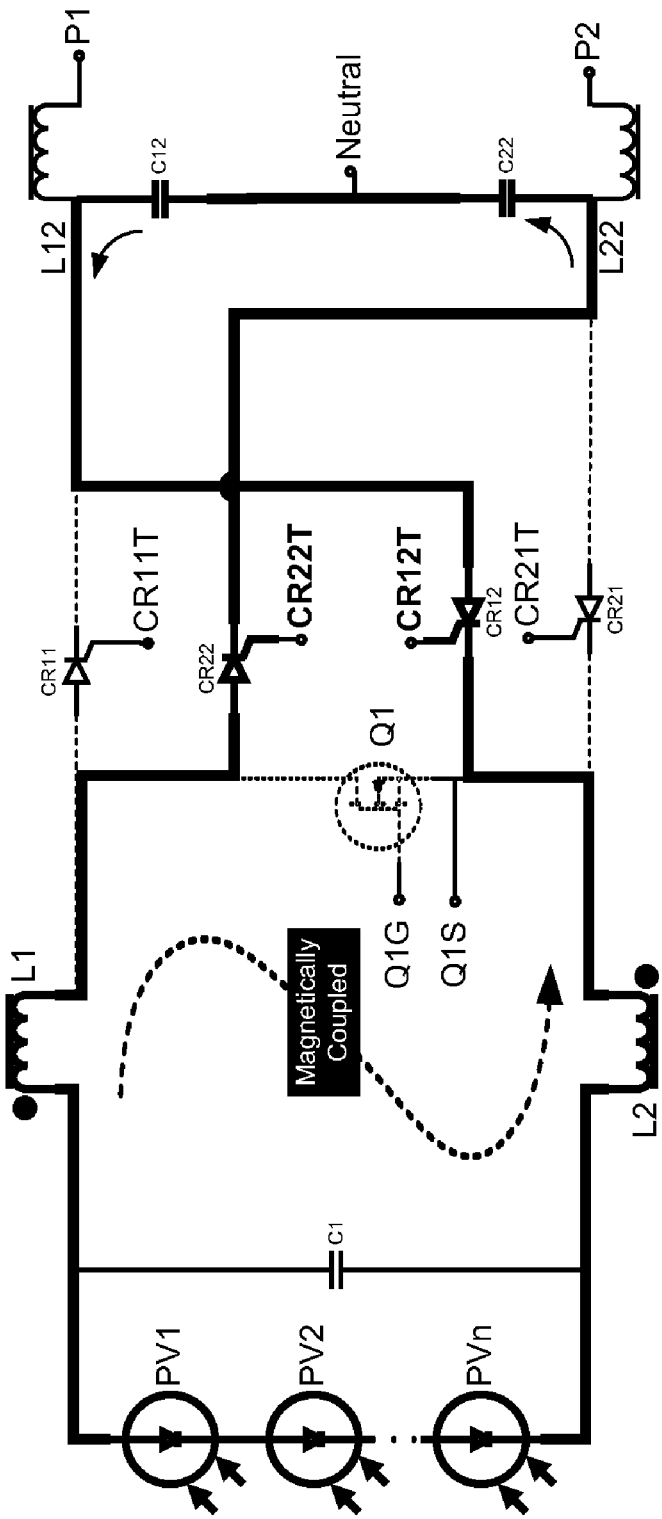
FIG. 8 shows a pulse amplitude modulated current converter with current flowing through into the reconstruction filters for the grid negative half phase.

Referring to FIG. 6, with L1 406 and L2 405 charged Q1, 404 is turned off for a pulse width modulated time. After the off time has expired, Q1 404 is turned on until the end of the instant current switching cycle. During the time that Q1 404 is off, current previously stored in L1 406 and L2 405 together with the current flowing in PV 401 is applied to the input terminals of CR12 425 and CR22 423 which remain enabled by signals CR22T 420 and CR12T 421 for the entire negative half cycle of the grid. The negative half cycle of the grid is defined as the condition wherein the voltage at terminal P1 434 is less than the voltage at terminal P2 436. The charge in the current pulse delivered through the SCR CR22 423 is initially stored on capacitor C22 440, creating a voltage more positive on the near end of coil L22 431 relative to the end connected to terminal P2 436. The charge in the current pulse delivered through CR12 425 is initially stored on C12, a voltage more positive on the near end of coil L12 430 relative to the end connected to terminal P1 434. This is the initial condition for both reconstruction filter comprising L12 430, C12 438 and reconstruction filter comprising L22 431, C22 440. At this point the reconstruction filters will transform the pulse width modulated current pulse delivered to them to a pulse amplitude modulated half sine wave of current delivered to the grid as shown in FIG. 4.

The reconstruction filters for Case 2 are the same components as described in association with Case 1; their design and operation are not repeated here.

The off time of Q1 404 is modulated such that the width of current pulses produced is in the shape of the grid sine wave. The reconstruction filters transform this sequence of pulse width modulated current pulses into a sequence of pulse amplitude modulated current pulses whose amplitude follow corresponding points of the shape of the grid sine wave.

So long as the grid half cycle remains negative, with the voltage of terminal P1 434 more negative than the voltage of terminal P2 436, further current pulses are produced by repeating the process described hereinbefore, beginning at "CASE 2: PWM modulation for negative half wave of grid."

The positive zero crossing of the grid voltage is defined as the condition wherein the voltage at terminal P1 434 is equal to P2 436 after the voltage at terminal P1 434 has been more negative than the voltage of terminal P2 436. Prior to the positive zero crossing, Q1 404 is turned on, removing current from SCRs CR12 425 and CR22 423. At this point the signals CR12T 421 and CR22T 420 are de-asserted, preventing SCRs CR12 425 and CR22 423 from conducting current during the grid positive half cycle. After the positive zero crossing with P1 434 more positive than P2 436, signals CR11T 419 and CR21T 421 are asserted, enabling SCRs CR11 424 and CR21 426 to conduct when current is applied to them.

With the grid again positive, the process would again return to the process described hereinbefore, beginning with the section labeled CASE 1: PWM modulation for positive half wave of the grid.

Figure 9:
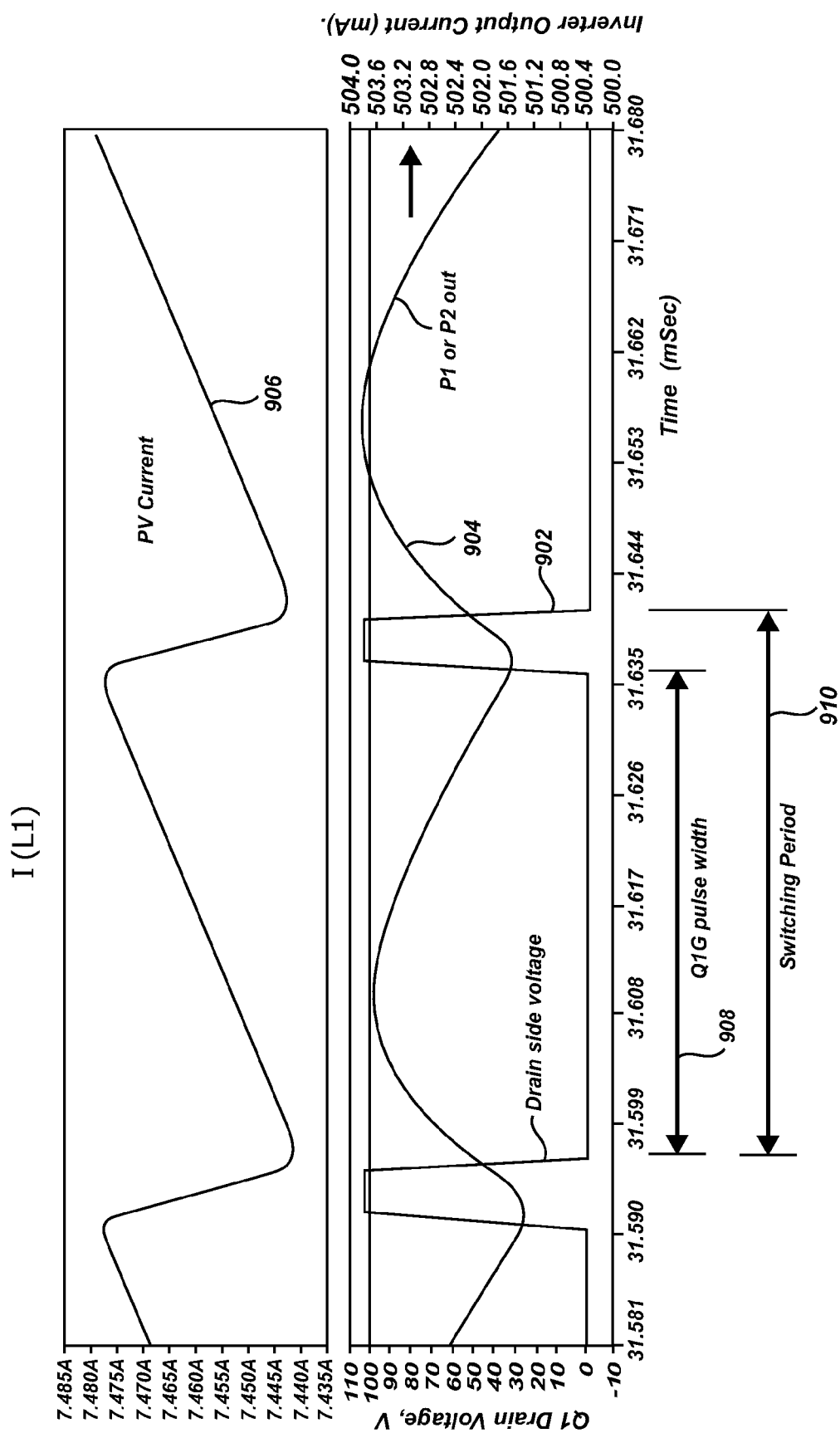
FIG. 9 relates the timing of drive signals and current.

FIG. 9 shows a signal diagram of the results of the conversion of a pulse width modulated pulse, translated into a pulse amplitude modulated (PAM) current pulse by a reconstruction filter, such as those previously disclosed hereinbefore (L12 430 and C12 438; L22 431 and C22 440). The short duration roughly rectangular voltage pulses 902 are the voltage on the drain side 451 (FIG. 4) of Q1 404. The pulse width labeled 908 approximates the pulse width of the signal Q1G on line 411 (FIG. 4) and the period 910 is the switching period of the PAMCC 400. This voltage drives the transformer 407 and PV 401 currents through a SCR CR11 424 or CR12 425 (depending upon the instant status of the control signals from controller 412, as previously described) into the input of one of the reconstruction filters. The rounded half wave rectified sine wave 904 is the output of the reconstruction filter. As the pulse width 908 (approximately) of the input pulse increases, the amplitude of the output wave form 904 increases. The triangular wave form 906 at the top of the graphs plots the variation of current through PV 401 during the common window of time. Trace 906 shows the effect of transformer 407 in maintaining a relatively constant PV 401 current, independent of the relatively large pulse width modulated current pulses provided to the reconstruction filters.

Figure 10:
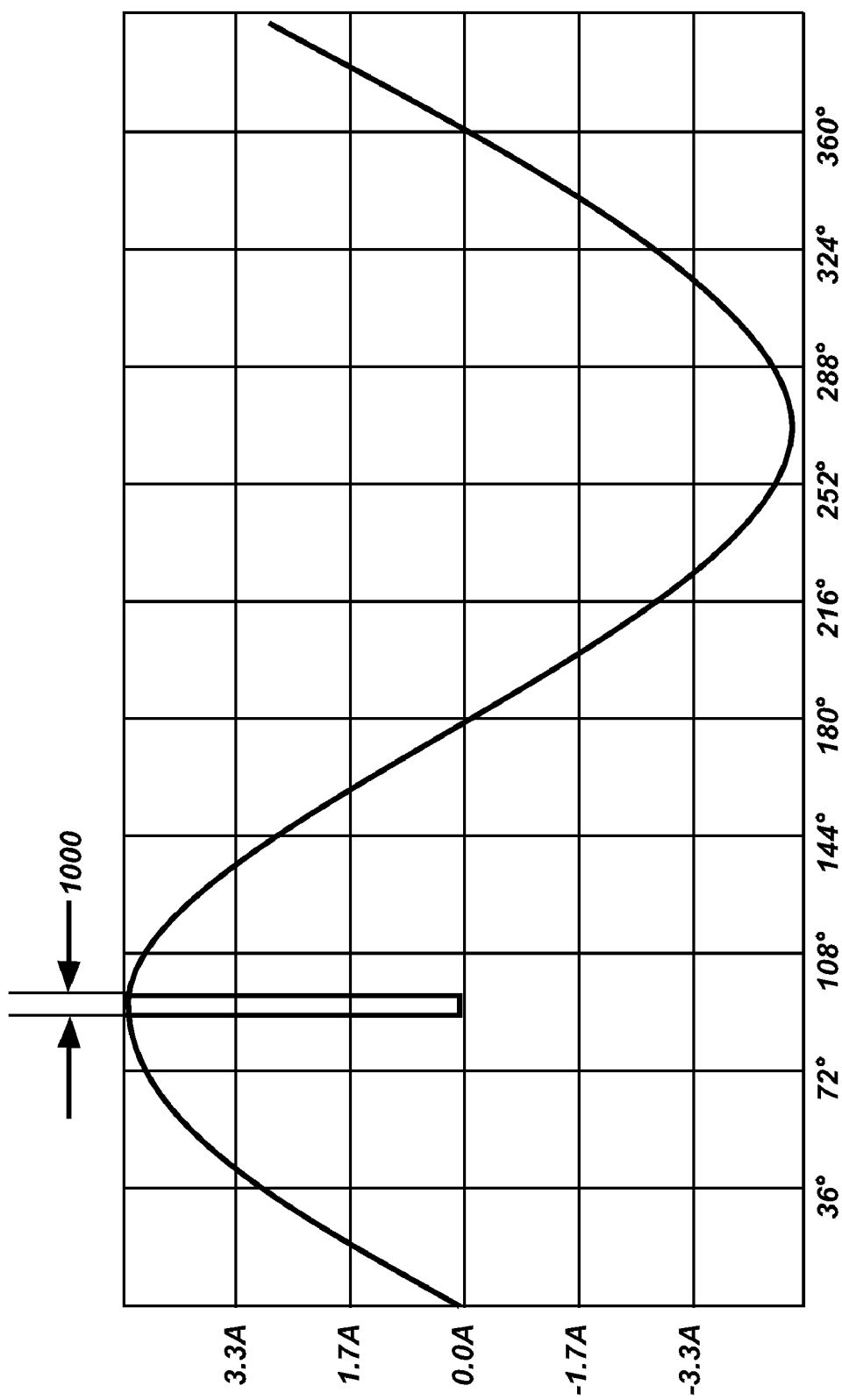
FIG. 10 shows what portion of current in a sine wave of current will be examined in detail in some following drawings.
Figure 11:
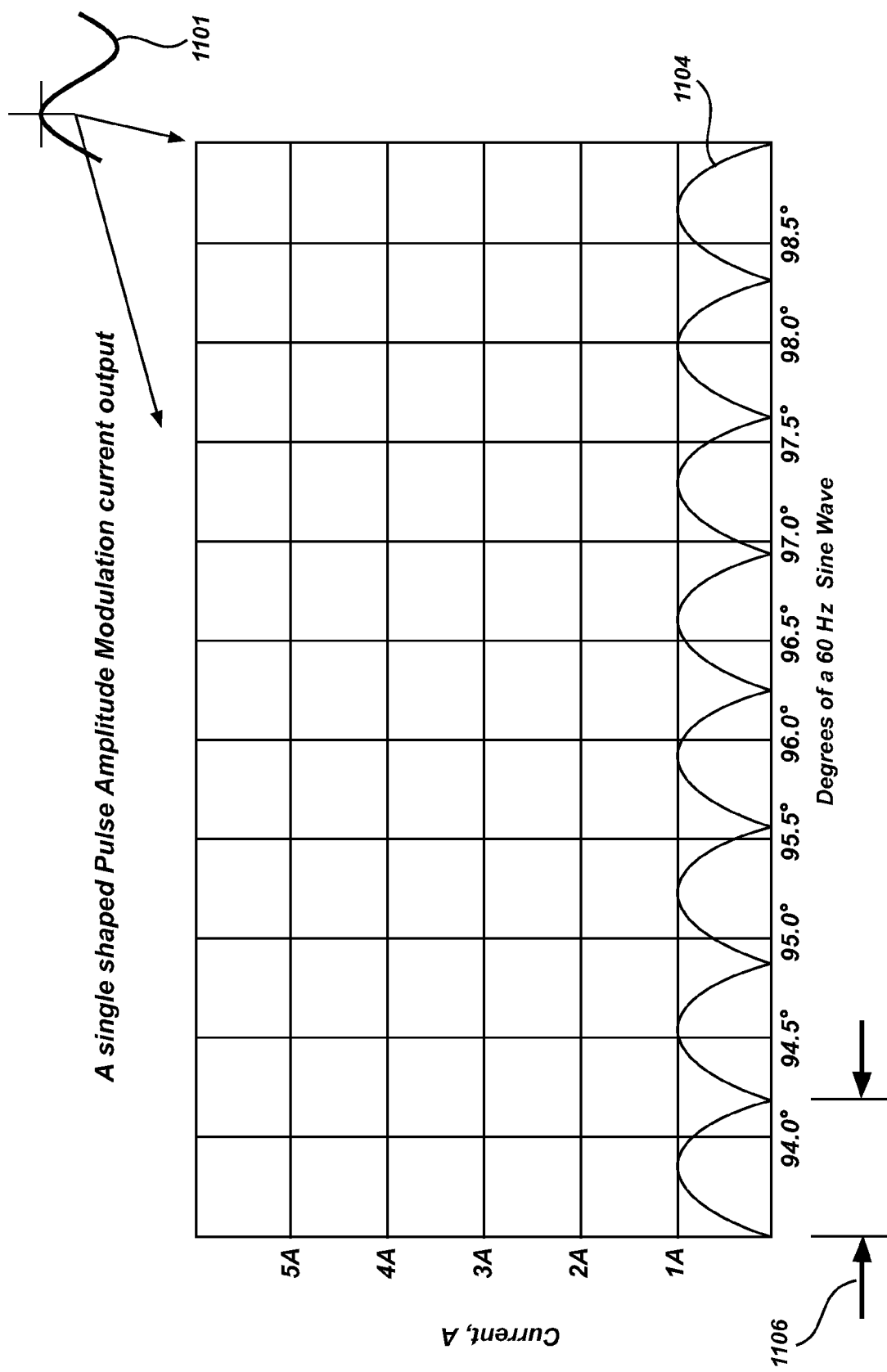
FIG. 11 shows the pulses provided by a single pulse amplitude modulated current converter.
Figure 12:
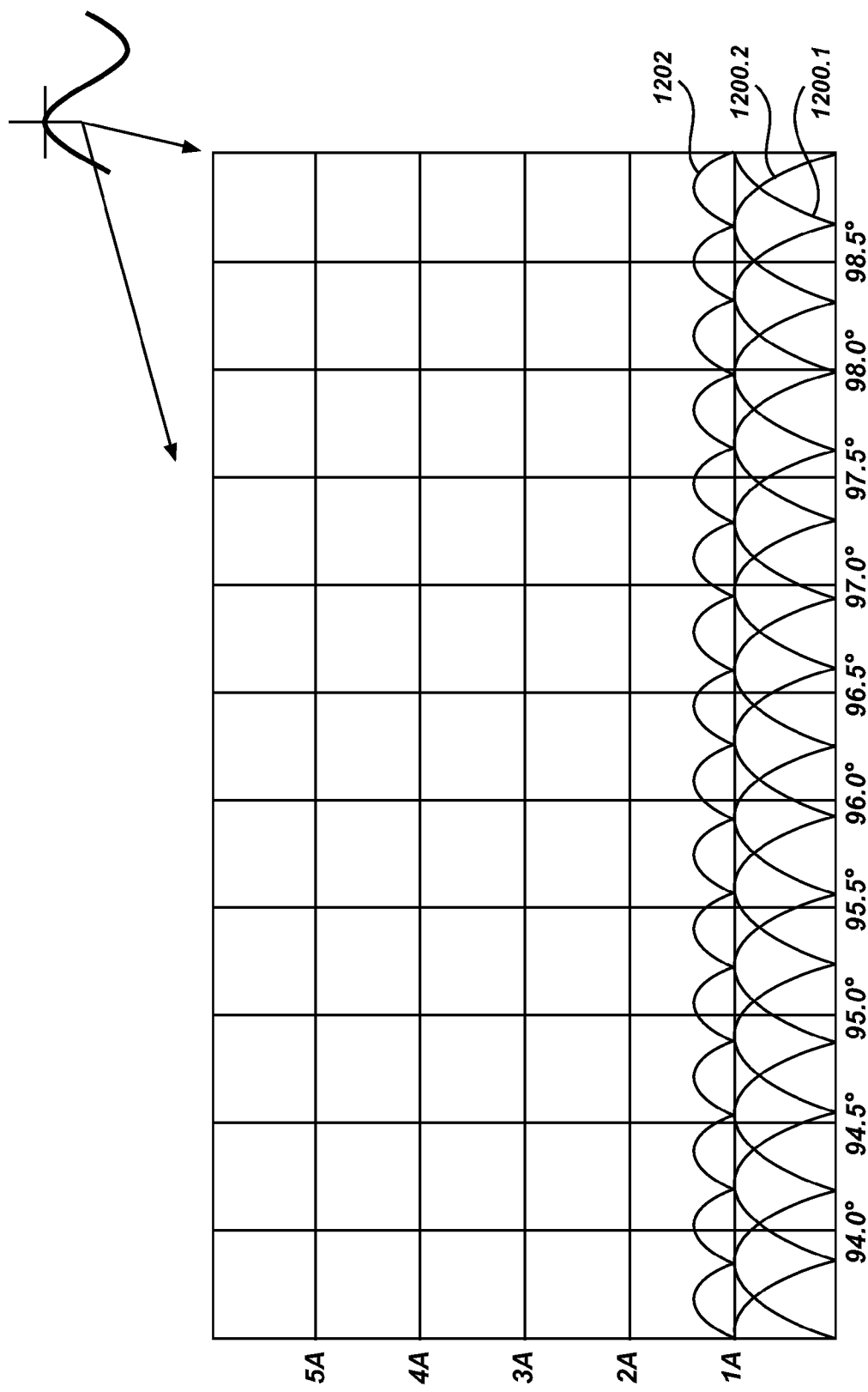
FIG. 12 shows the pulses provided by two pulse amplitude modulated current converters and their total, summed current.
Figure 13:
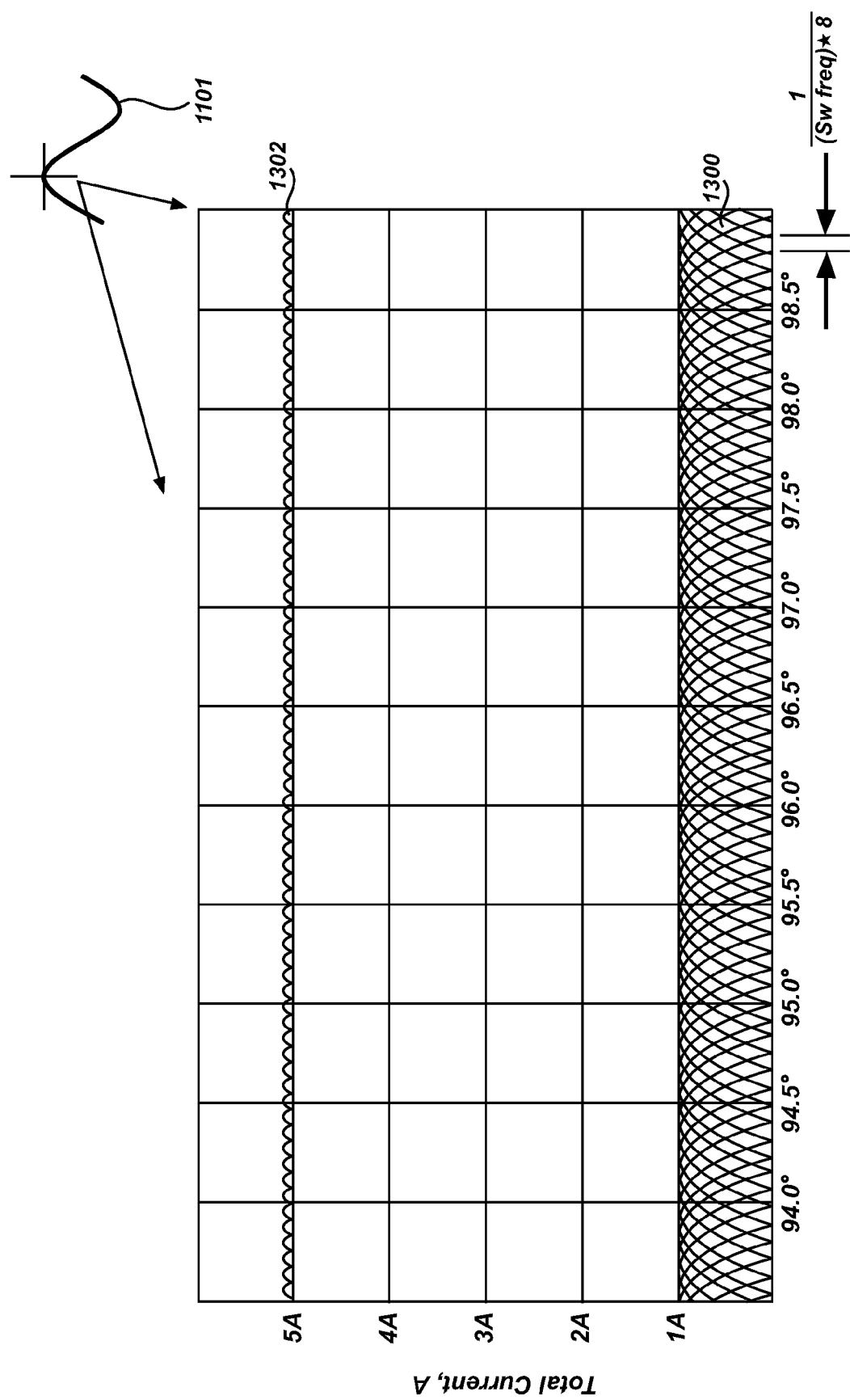
FIG. 13 shows the pulses provided by eight pulse amplitude modulated current converters and their total, summed current.

FIG. 10 indicates the narrow time slice of a grid sine wave cycle to be depicted in FIGS. 11, 12 and 13.

FIG. 11 shows the pulse amplitude modulated output current of a single PAMCC 400. Note that the amplitude shown is for a small portion of time near the positive peak of the grid voltage as indicated on the cycle example 1101. The individual pulses 1104 have a period 1106 equal to the period of the switching frequency, for example (1/30 KHz).

In FIG. 12, two individual currents (1200.1 and 1200.2) of two PAMCCs (each in accordance with the PAMCC 400) are phased apart one half of the period of the switching frequency. The trace 1202 above is the sum of the two PAMCC output currents 1200.1 and 1200.2. Note that the summed current 1202 has a much smaller ripple than the ripple of a single PAMCC (see FIG. 11) and has twice the ripple frequency as of the ripple frequency of a single inverter. The summed current 1202 does not return to zero.

Following on the summation of the currents of two PAMCC 400 outputs, FIG. 13 shows the individual output currents of eight PAMCCs (the line 1300 is representative; each waveform is not numbered), each phased evenly across the period of the switching frequency. For example for a system using a 30 KHz switching frequency, the period is 33.3 microseconds and each phase is delayed by (33.3/8), or 4.167 microseconds, relative to the previous output current waveform. Any number of PAMCCs 400 may be so summed. As the number summed increases they are each phase delayed by a smaller number (1/(switching frequency)*n) where "n" is the number of PAMCCs summed. Note that the summed current shown in FIG. 13 has only a fraction of the ripple current of an individual PAMCC (FIG. 12) and has eight times the ripple frequency of that of an individual PAMCC. If each PAMCC 400 is producing a point on a grid sine wave with its sequence of PAM current pulses, phasing and summing a set of PAMCCs, forming an array of converters, will effectively demodulate a grid sine wave of current with very high accuracy and very low noise (ripple). Any number of array converters may be phased and summed in this way. As the number of PAMCCs is increased, the ripple amplitude decreases and the ripple frequency increases. In one embodiment two or more of the plurality of PAMCC 400 individual output currents are in phase with each other. In some embodiments the switching frequency is selected so as to be unrelated to the grid frequency, for example 60 Hz in the United States, the ripple will not represent harmonic distortion. Signals modulated onto the PAMCC output are arbitrary. In some embodiments multiple signals are modulated onto the PAMCC output, wherein one of such signals may, for example, provide for communication between an arbitrary two or more PAMCC modules. The PAMCC modulation is sometimes used to correct for distortion in the grid signal.

One of several ways to choose the phasing of the arrayed PAMCCs 400 is for each PAMCC 400 to be pre-assigned a timing slot number, with the first slot being scheduled following a zero crossing and each PAMCC 400 firing its PAM signal in the predetermined (i.e., assigned) sequence.

Figure 14:
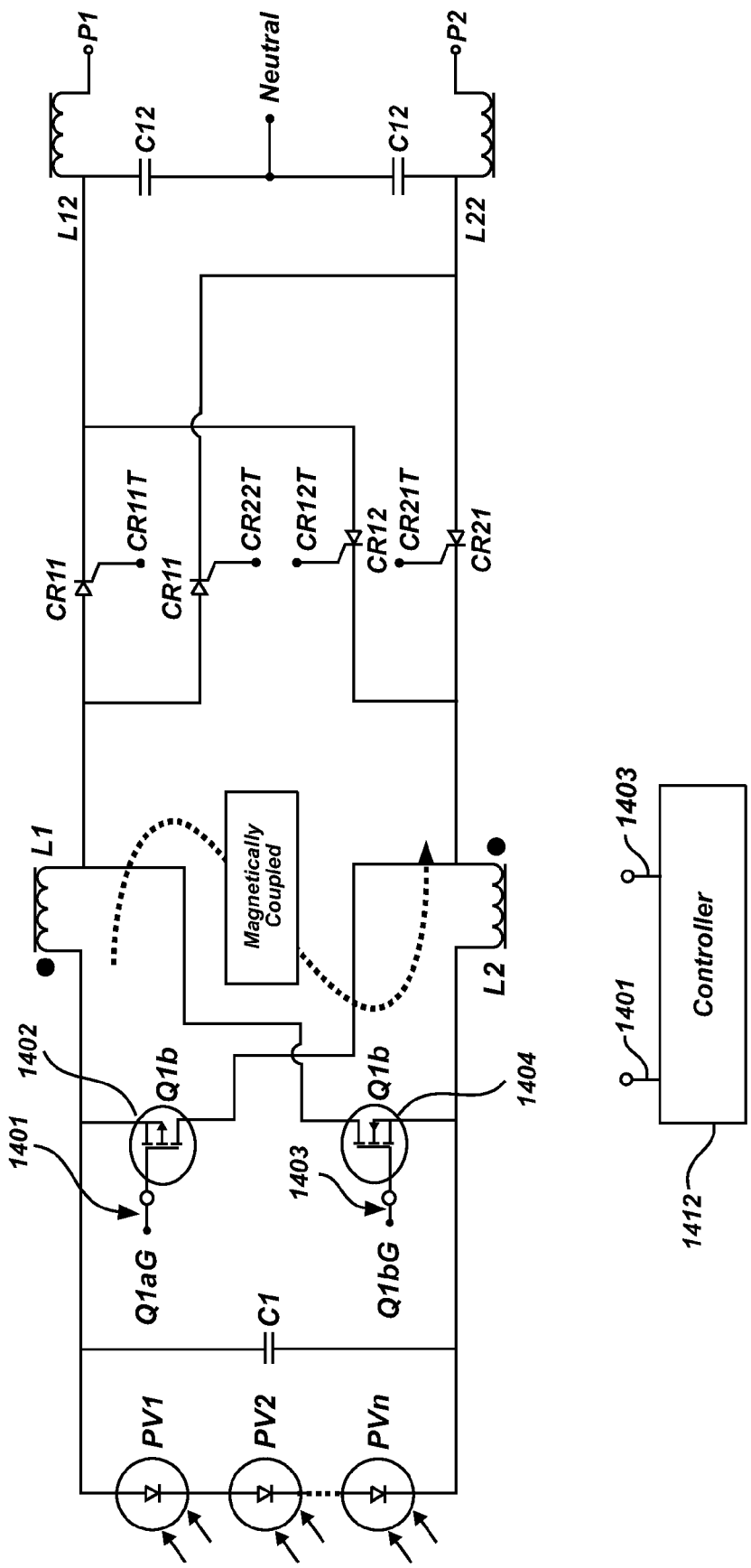
FIG. 14 shows an alternative circuit for a single pulse amplitude modulated current converter.

In an alternative embodiment, exemplified in FIG. 14, a second transistor is added, wherein Q1A 1402 and Q1B 1404 replace the single transistor Q1 404 as was shown and described in the circuit of FIG. 4. Using the two transistors Q1A 1402 and Q1B 1404 provides some potential advantages, including reducing the voltage across each transistor, allowing a more relaxed Rds_on (the "on" resistance) requirement for each transistor compared to the Rds_on requirement of Q1 404, and allowing each transistor to be driven with respect to the relatively low voltage and stable anode and cathode ends of PV 401. In this configuration, Q1A 1402 and Q1B 1404 are both turned on and off at the same times as with Q1 404 in the previous discussion. All other aspects of the circuit operation remain the same. Q1A 1402 and Q1B 1404 are of different transistor types, so separate signals to their control gates are provided by the control 1412. Controller 1412 is otherwise the same as controller 412 of FIG. 12, with the addition of output terminals connected to the control gates of Q1A 1402 and Q1B 1404 via lines 1401 and 1403 respectively.

Figure 15:
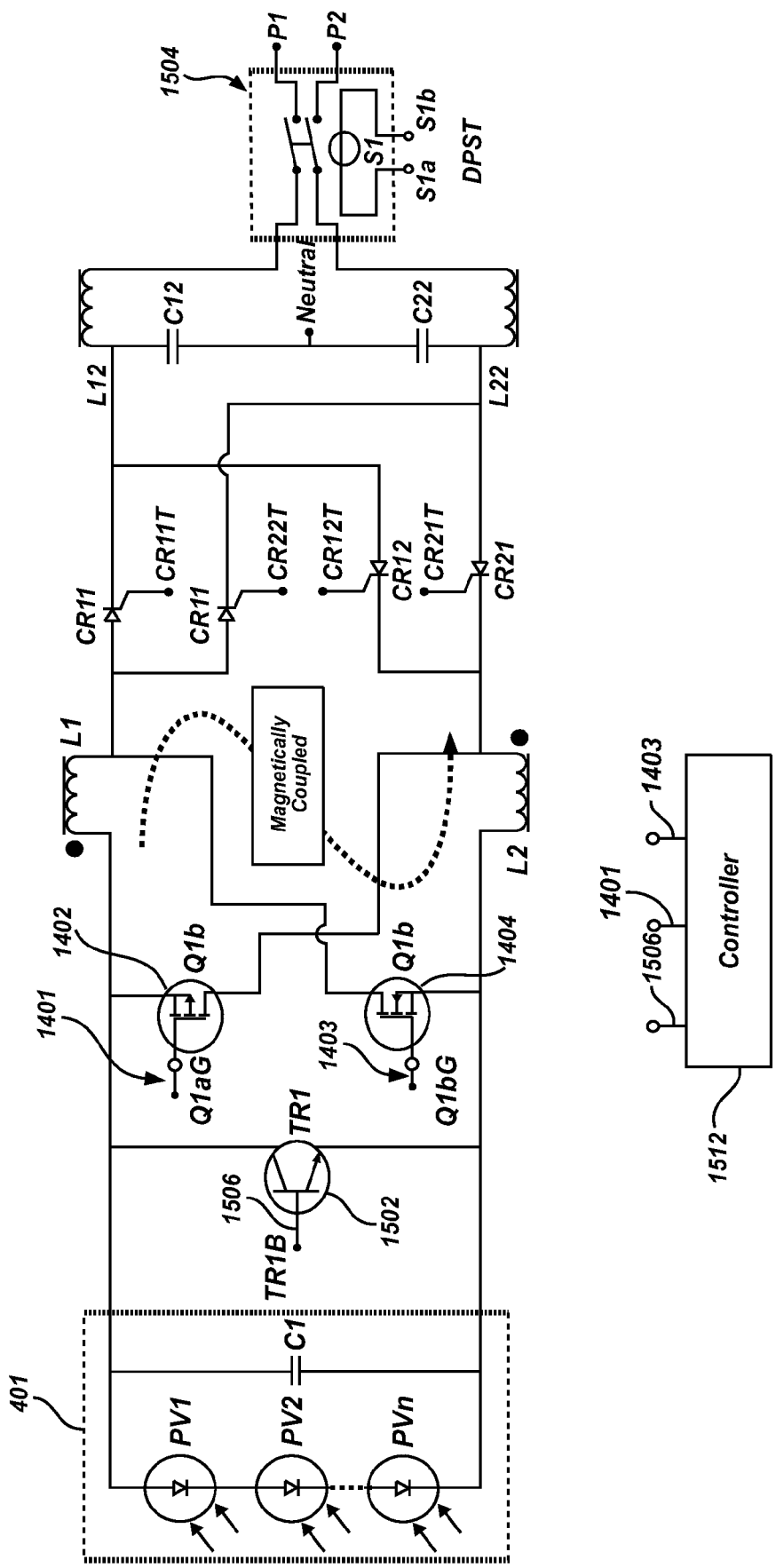
FIG. 15 shows a circuit for a single pulse amplitude modulated current converter wherein the converter can be disabled.

In some embodiments the system may be shut down for safety, maintenance, or other purposes. One example of a shut-down method is shown in FIG. 15. A transistor TR1 1502 and a relay S1 1504 are added as shown. Note that this example includes the two transistors Q1A 1402 and Q1B 1404, however the same shut-down provision can be added to the circuit of FIG. 4, wherein the two transistors Q1A and Q1B are replaced by the single transistor Q1 404. Transistor TR1 1502 and relay S1 1504 provide for the safe shutdown of PAMCC while connected to PV 401, which is illuminated and producing power. The shutdown process is initiated by providing a signal TR1B from controller 1512 on a line 1506, the line 1506 connected to the control gate of the transistor 1502. When transistor TR1 1502 turns on, TR1 creates a short path for current produced by PV 401, which results in the voltage across PV 401 to be reduced to a small level. At this point, Q1A 1402 and Q1C 1404 are energized to allow the currents in the coils L1 406 and L2 405 to fall to a low level. After the coils L1 and L2 are discharged, relay S1 1504 is opened. With the path to the grid now open, Q1A 1402 and Q1B 1404 are turned off, followed by turning off transistor TR1 1502. In this configuration, no further power will be produced.

Figure 16:
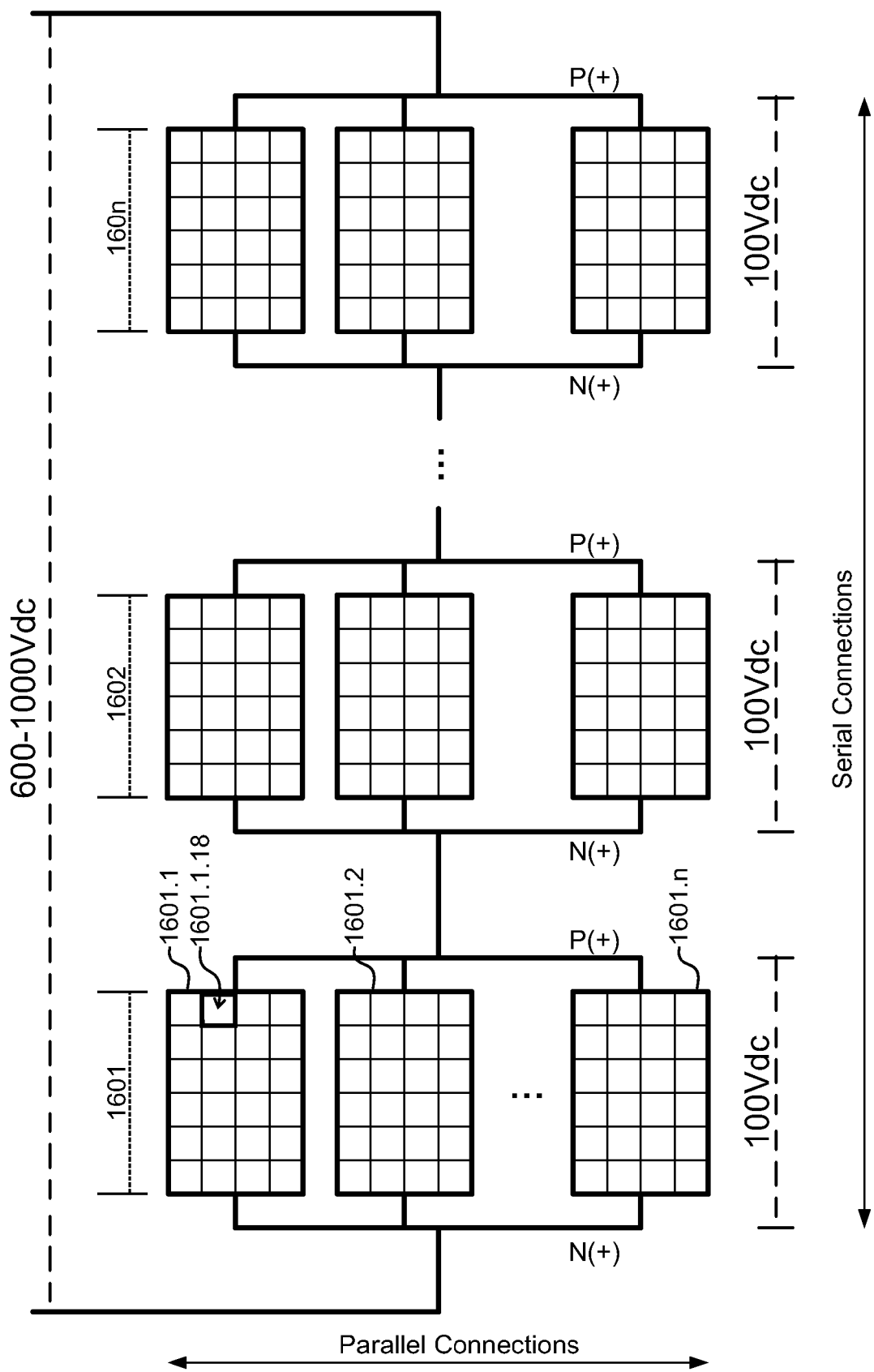
FIG. 16 is an example of a series/parallel configuration of power sources to provide direct current.

Looking to FIG. 16, a series/parallel configuration of power sources, wherein the power sources may be solar panels, batteries, wind power generators, tidal power generators, piezoelectric power generators (any electrical source may be used), are connected as shown. Note that an array, for example array 1601.1, within a stage 1601, 1602, 160$n$, wherein "n" may be any number of additional stages, may be a single power source, such as a PV panel with a single array converter controlling the panel output. In this arrangement a square in the drawing such as 1601.1.18 represents a single cell within a solar panel or, likewise, a subset element of another type power source wherein the subsets are electrically connected to provide a single source of DC current, which an array converter then manages. That is, each of 1601.1, 1601.2 to 1601.$n$ are "n" solar panels with a single array converter each, configured as shown to form a single stage 1601. The voltage across each of the elements 1601.1, 1601.2, 1601.$n$ is in common, and their currents are combined to be provided to another stage, shown in FIG. 16 as stage 1602.

In a similar fashion, each of the smaller squares, typified by square 1601.1.18, may be a complete power source, such as a solar panel plus an array converter, configured to provide for a common output voltage from the array of power sources plus array converters to form the element shown as element 1601.1 (typical of the rest).

A second stage 1602 is connected in the same manner as the first stage 1601, wherein the negative terminal of the stage 1602 is connected to the positive terminal of the first stage 1601. The voltage output of the series-connected stages is the sum of the voltages of the two stages combined. Additional stages, indicated by reference 160$n$, wherein "n" may be any number of stages, may be added, again increasing the combined voltage output by the summation of the various voltage gains. Note that the technology of one stage may be different than the technology of another stage or stages.

By way of example, consider the scenario wherein a given module in an array of solar panels, for example module 1601.1, stage 1601, loses some of its power capacity due to shading, dirt, localized sky conditions, physical damage, or interconnect failure at the solar cell denominated 1601.1.18. In the prior art bypass diodes are sometimes used to protect against damage to a weak unit by the more powerful remaining power units. This, however, causes a power loss and the generation of heat. In the present invention the array converter of the unit 1601.1 is configured to respond. In one embodiment the array converter provides less current to keep the desired voltage drop across the panel 1601.1. This results in the total current being reduced as the stages are in series, thus a common current. In some embodiments the system is expected to provide a constant current to a load, so the array converters are configured to provide the expected current at a lower voltage. The array converters of the other elements 1601.2, 1601.$n$ provide the same (lower) voltage, a requirement for parallel power sources. The voltages shown in FIG. 16 are typical examples, not design requirements.

Figure 17:
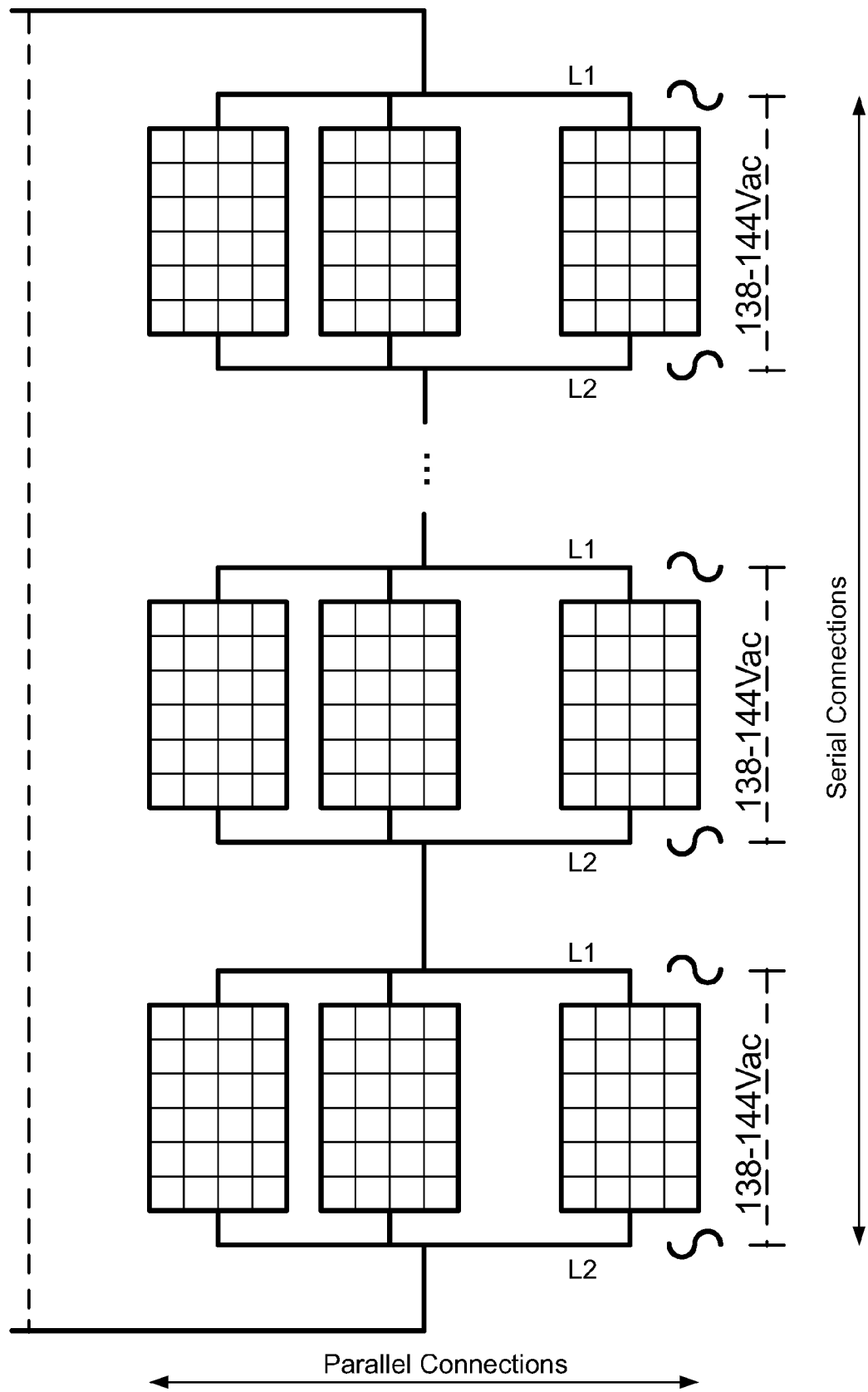
FIG. 17 is an example of a series/parallel configuration of power sources to provide alternating current.

FIG. 17 is similar to FIG. 16, except that the modules have been configured to provide single phase alternating current. As with the circuit of FIG. 16, the voltages of the stages stack up. Because the array converters associated with each module are provided with communication ability, as previously described hereinbefore, each stage can stay in phase with the previous stage to which it is connected. Again, in the event of a failure of a given module or modules, the remaining modules/stages are configured to maintain the desired voltage or current output of the system. The voltages shown in FIG. 17 are typical examples, not design requirements.

Figure 18:
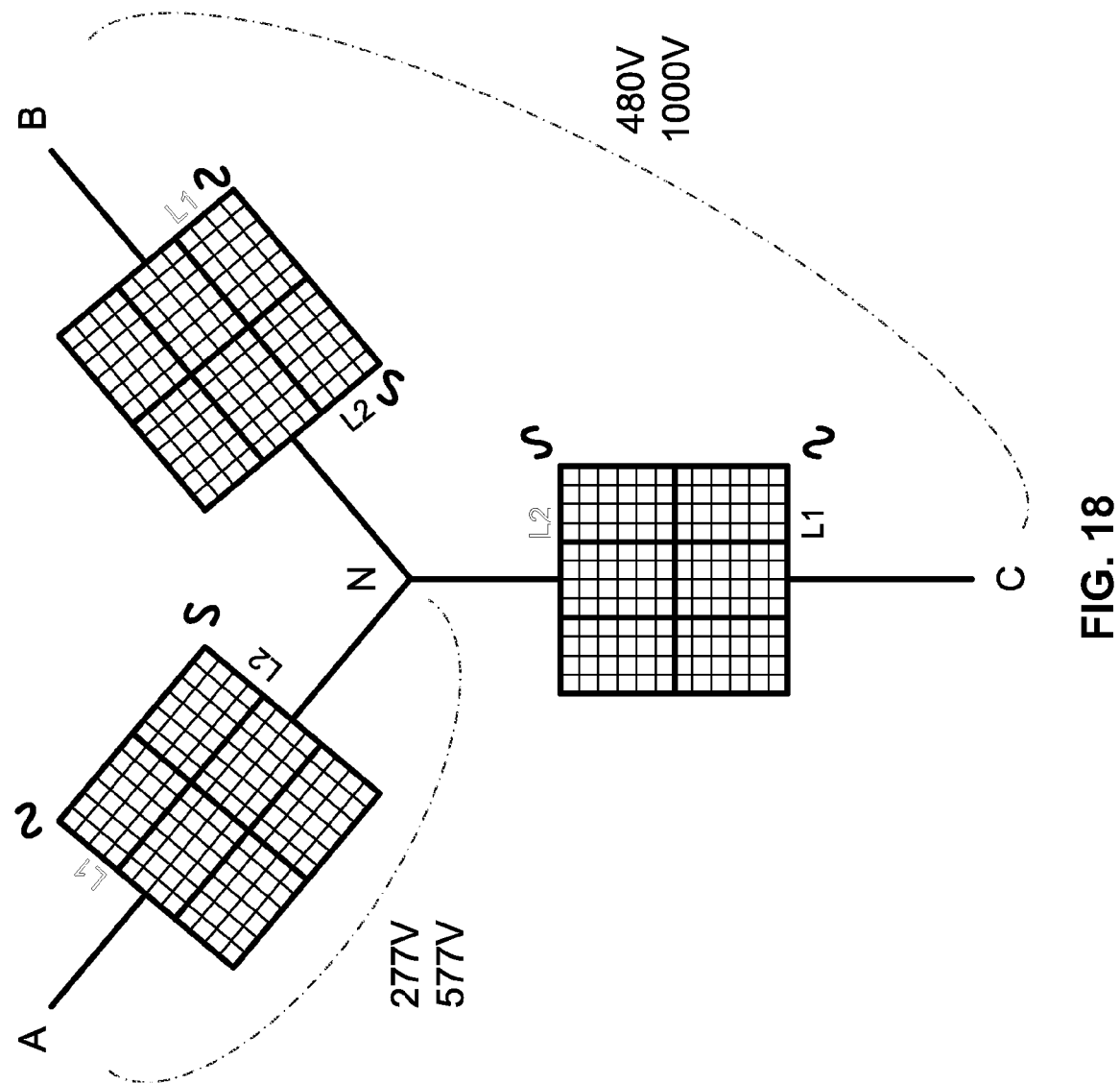
FIG. 18 is a "Y" configuration of power sources to provide three phase alternating current.

FIG. 18 is a three-phase version of the FIG. 17 configuration. As with the two-phase configuration, the array converter modules communicate with each other to maintain the correct phase relationship such that the system-level power loss is only to the degree of the loss of a given power source. Note that only one stage per branch (A-N, B-N, C-N) is shown in FIG. 18, but one skilled in the art will recognize that any or all of the three branches may be comprised of multiple stages in series similar to the configuration shown in FIG. 17. The voltages shown in FIG. 18 are typical examples, not design requirements.

What is claimed is:

1. A system for converting electrical power, the system comprising:

two or more stages of electrical power wherein each stage is comprised of:

a plurality of pulse amplitude modulated current converters ("converters"), wherein each of the converters receives direct electrical current from a respective direct electrical current source and provides pulse amplitude modulated current pulses at an output terminal of the converter and further wherein the output terminal of each converter is electrically connected in parallel with the output terminals of all of the other converters in the stage and further wherein the current pulses of at least two converters are out of phase with respect to each other, thereby summing the current pulses of all of the converters such that a signal modulated onto the pulse output of the converters is demodulated;

wherein the two or more stages are electrically connected in series.

2. The system according to claim 1, wherein the current pulse of each converter is out of phase with respect to the current pulses of all other converters.

3. The system according to claim 1 wherein the signal is a sixty-cycle alternating current voltage.

4. The system according to claim 1 wherein the signal is an approximately fixed value of direct current voltage.

5. A system for converting electrical power, the system comprising:

three branches of electrical power wherein each branch is comprised of at least one stage of electrical power, each stage of electrical power comprising:

a plurality of pulse amplitude modulated current converters ("converters"), wherein each of the converters receives direct electrical current from a respective direct electrical current source and provides pulse amplitude modulated current pulses at an output terminal of the converter and further wherein the output terminal of each converter is electrically connected in parallel with the output terminals of all of the other converters in the stage and further wherein the current pulses of at least two converters are out of phase with respect to each other, thereby summing the current pulses of all of the converters such that a signal modulated onto the pulse output of the converters is demodulated;

wherein the three branches are connected in a "Y" configuration wherein each branch includes a terminal electrically connected to a common point with all other terminals.

6. The system according to claim 5, wherein the current pulse of each converter is out of phase with respect to the current pulses of all other converters.

7. The system according to claim 5 wherein the signal is a sixty-cycle alternating current voltage.

* * * * *